(12) United States Patent
Sato

(10) Patent No.: US 9,559,643 B2
(45) Date of Patent: Jan. 31, 2017

(54) AMPLIFIER CIRCUIT

(71) Applicant: FUJITSU LIMITED, Kawasaki-shi, Kanagawa (JP)

(72) Inventor: Masaru Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 17 days.

(21) Appl. No.: 14/474,640

(22) Filed: Sep. 2, 2014

(65) Prior Publication Data

US 2015/0116036 A1    Apr. 30, 2015

(30) Foreign Application Priority Data

Oct. 29, 2013    (JP) .................................. 2013-224491

(51) Int. Cl.
*H03F 3/04* (2006.01)
*H03F 3/193* (2006.01)
*H03F 3/60* (2006.01)

(52) U.S. Cl.
CPC .............. *H03F 3/193* (2013.01); *H03F 3/607* (2013.01); *H03F 2200/09* (2013.01)

(58) Field of Classification Search
CPC ....................... H03F 2200/09; H03F 2200/372
USPC ...................... 330/301–302, 124 R, 295, 286
See application file for complete search history.

(56) References Cited

U.S. PATENT DOCUMENTS

| 4,446,445 A | 5/1984 | Apel |
| 4,845,440 A * | 7/1989 | Aitchison ............... H03F 3/607 |
| | | 330/277 |
| 4,987,377 A | 1/1991 | Gray et al. |
| 5,061,910 A * | 10/1991 | Bouny ................ H01F 27/2804 |
| | | 330/275 |
| 5,105,166 A * | 4/1992 | Tsukii ..................... H03F 3/607 |
| | | 330/277 |
| 2002/0079970 A1 | 6/2002 | Morimoto et al. |
| 2004/0202311 A1 | 10/2004 | Zhao et al. |
| 2006/0270368 A1* | 11/2006 | Caimi ..................... H01Q 1/36 |
| | | 455/129 |

FOREIGN PATENT DOCUMENTS

| EP | 0285345 A2 | 10/1988 |
| JP | 2-241029 | 9/1990 |
| JP | 8-028607 | 3/1996 |
| JP | 2002-252529 | 9/2002 |
| JP | 2004-289554 | 10/2004 |

OTHER PUBLICATIONS

EESR—Extended European Search Report of European Patent Application No. 14183530.6 dated Mar. 9, 2015.

* cited by examiner

*Primary Examiner* — Khanh V Nguyen
*Assistant Examiner* — Khiem Nguyen
(74) *Attorney, Agent, or Firm* — Fujitsu Patent Center

(57) ABSTRACT

An amplifier circuit includes: first and second nodes configured to receive input of differential signals; third and fourth nodes; a plurality of first inductors configured to be connected in series between the first and second nodes; a plurality of second inductors configured to be connected in series between the third and fourth nodes; a plurality of field effect transistors configured to have gates each configured to be connected between the plurality of first inductors, sources each configured to be connected to a reference potential node, and drains each configured to be connected between the plurality of second inductors; and a synthesizing unit configured to synthesize signals at the third and fourth nodes.

2 Claims, 4 Drawing Sheets

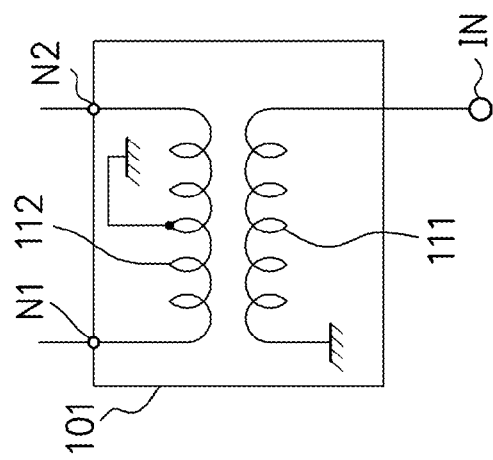
F I G. 1B
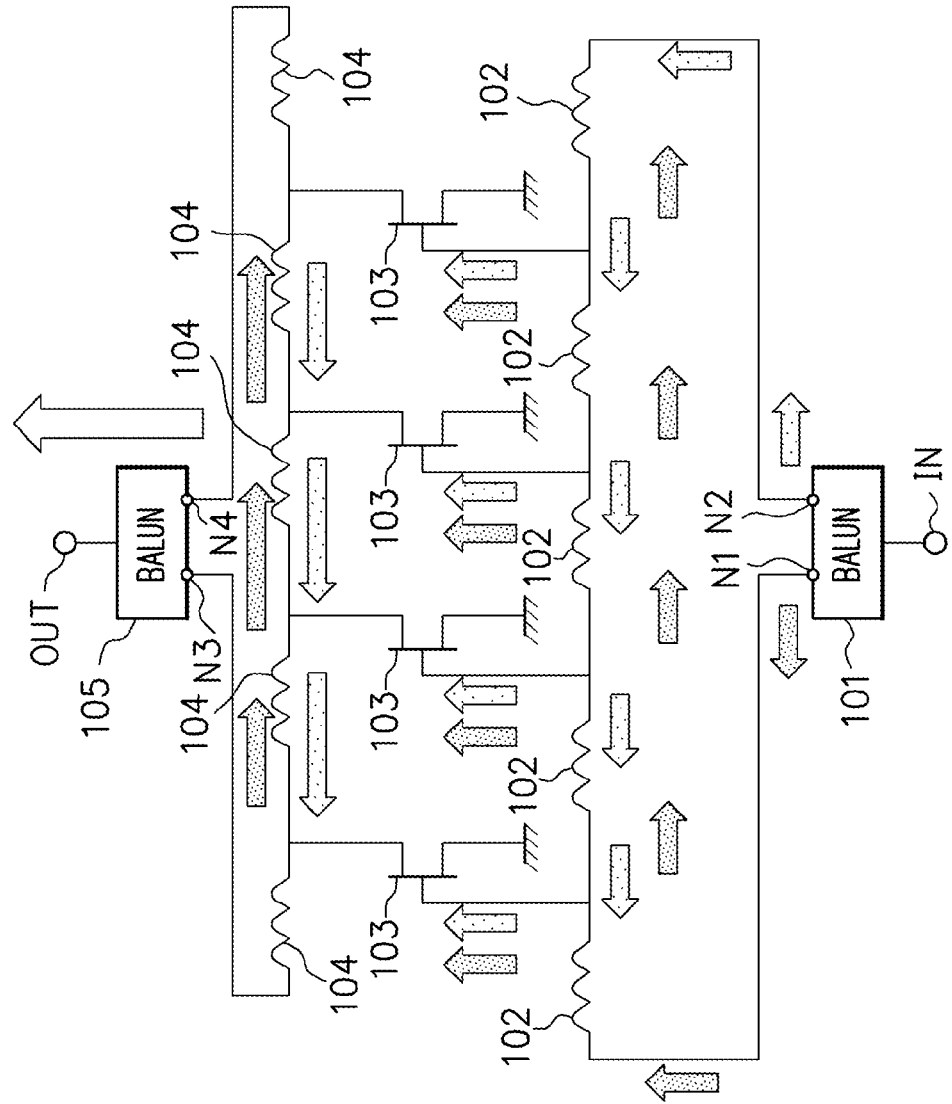
F I G. 1A

F I G. 2
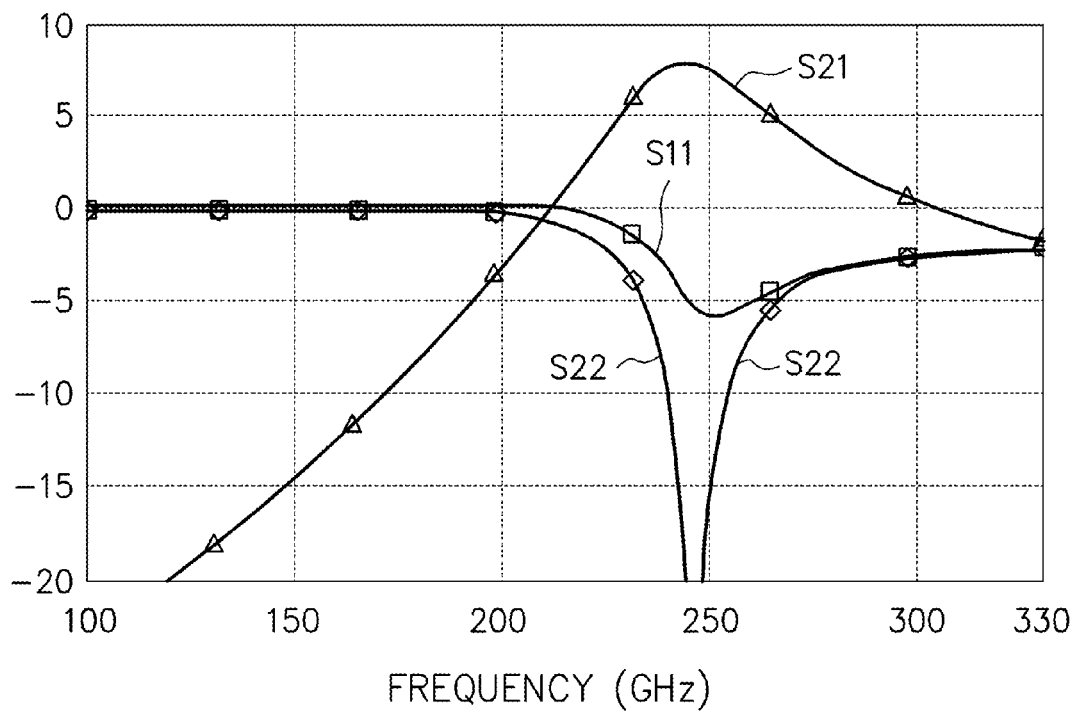

… (US 9,559,643 B2)

AMPLIFIER CIRCUIT

CROSS-REFERENCE TO RELATED APPLICATION

This application is based upon and claims the benefit of priority of the prior Japanese Patent Application No. 2013-224491, filed on Oct. 29, 2013, the entire contents of which are incorporated herein by reference.

FIELD

The embodiments discussed herein are directed to an amplifier circuit.

BACKGROUND

A balun circuit that provides a single terminal signal port and a balanced signal port is known (refer to, for example, Patent Document 1). A first conductive element extends between the single terminal signal port and the ground. A second conductive element is coupled to the first conductive element like a transformer and electrically insulated from the first conductive element. The second conductive element electrically symmetrically extends from the ground to the balanced port. The first and second conductive elements are arranged opposed to each other across an electrical insulating layer. The balanced port is located electrically at the center of the second conductive element. The first conductive element is arranged such that the center point of the first conductive element, namely, the point defined as an electrical center of the first conductive element is opposed to the balanced port, and thereby be operable at a plurality of frequencies.

Further, there is a known high-frequency power amplifier having a pair of power amplifier elements that receive from the outside a first distribution signal and a second distribution signal distributed to have the same amplitude and the characteristics in opposite phases to each other and amplify and output the power of the received first distribution signal and second distribution signal (refer to, for example, Patent Document 2). A pair of transmission lines correspondingly connected to the pair of power amplifier elements are provided. The pair of transmission lines have a pair of bulging parts provided on side parts opposed to each other. The pair of bulging parts are opposed to each other at a space therebetween to constitute a capacitor.

Further, there is a known differential type distributed constant amplifier in which a grounded-source transistor and a grounded-gate transistor are cascode-connected (refer to, for example, Patent Document 3). The inductor suppresses reflection at a branch point of a distributed constant line on the input side.

[Patent Document 1] Japanese Examined Patent Application Publication No. 8-28607
[Patent Document 2] Japanese Laid-open Patent Publication No. 2002-252529
[Patent Document 3] Japanese Laid-open Patent Publication No. 2004-289554

An amplifier circuit is needed which can amplify a high-frequency signal with large output power and high gain. To increase the output power, it is necessary to increase the size of the transistor. However, increasing the size of the transistor decreases the gain of the high-frequency signal.

SUMMARY

An amplifier circuit includes: first and second nodes configured to receive input of differential signals; third and fourth nodes; a plurality of first inductors configured to be connected in series between the first and second nodes; a plurality of second inductors configured to be connected in series between the third and fourth nodes; a plurality of field effect transistors configured to have gates each configured to be connected between the plurality of first inductors, sources each configured to be connected to a reference potential node, and drains each configured to be connected between the plurality of second inductors; and a synthesizing unit configured to synthesize signals at the third and fourth nodes.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1A and FIG. 1B are diagrams illustrating a configuration example of an amplifier circuit according to a first embodiment;

FIG. 2 is a chart illustrating a simulation result of frequency characteristics of the gain of the amplifier circuit in FIG. 1A;

DESCRIPTION OF EMBODIMENTS

First Embodiment

Figure 3B:
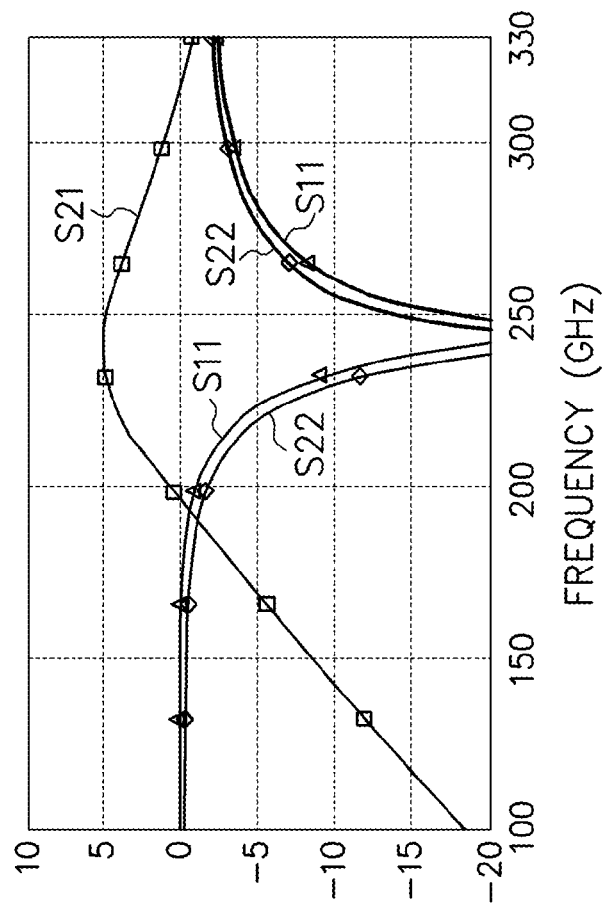
FIG. 3B is a chart illustrating a simulation result of frequency characteristics of the gain of the differential amplifier circuit in FIG. 3A.

FIG. 1A is a diagram illustrating a configuration example of an amplifier circuit according to a first embodiment. The amplifier circuit amplifies a signal inputted into an input terminal IN and outputs the amplified signal from an output terminal OUT. The amplifier circuit has a first balun circuit 101, a plurality of first inductors 102, a plurality of n-channel field effect transistors 103, a plurality of second inductors 104, and a second balun circuit 105. The first balun circuit 101 converts a single-phase signal inputted into the input terminal IN to differential signals, and outputs the differential signals to a first node N1 and a second node N2. The signals at the first node N1 and the second node N2 are differential signals equal in amplitude and opposite in phase to each other.

FIG. 1B is a diagram illustrating a configuration example of the balun circuit 101. The balun circuit 101 has a primary side inductor 111 and a secondary side inductor 112. The primary side inductor 111 is connected between the input terminal IN and a reference potential node (for example, a ground potential node). The secondary side inductor 112 is connected between the first node N1 and the second node N2, and its midpoint is connected to the reference potential node.

Note that the balun circuit 101 is not limited to the configuration in FIG. 1B. For example, the balun circuit 101 may output the signal at the input terminal IN as it is to the first node N1 and delay the signal at the input terminal IN by 180 degrees by a delay circuit and output the delayed signal to the second node N2 to thereby generate differential signals.

In FIG. 1A, the first node N1 and the second node N2 receive input of the differential signals from the first balun circuit 101. The plurality of first inductors 102 are connected in series between the first node N1 and the second node N2. The plurality of second inductors 104 are connected in series between a third node N3 and a fourth node N4. The plurality of field effect transistors 103 have gates each of which is connected between the plurality of first inductors 102, sources each of which is connected to the reference potential node, and drains each of which is connected between the plurality of second inductors 104. The second balun circuit 105 is a synthesizing unit which synthesizes the signals at the third node N3 and the fourth node N4 and outputs the synthesized wired signal to the output terminal OUT. The second balun circuit 105 has the same configuration as that of the first balun circuit 101.

The capacity between the gate and the source of the field effect transistor 103 and the first inductor 102 constitute an input matching circuit. Assuming that the capacitance of the capacity between the gate and the source of the field effect transistor 103 is C and the inductance of the first inductor 102 is L, the characteristic impedance is expressed by $\sqrt{(L/C)}$. Setting the characteristic impedance $\sqrt{(L/C)}$ to, for example, 50Ω for matching makes it possible to decrease the reflected wave of the input signal into the amplifier circuit to prevent attenuation of the input signal. Thus, the gain of the amplifier circuit can be improved.

Similarly, the capacity between the gate and the source of the field effect transistor 103 and the second inductor 104 constitute an output matching circuit. Assuming that the capacitance of the capacity between the gate and the source of the field effect transistor 103 is C and the inductance of the second inductor 104 is L, the characteristic impedance is expressed by $\sqrt{(L/C)}$. Setting the characteristic impedance $\sqrt{(L/C)}$ to, for example, 50Ω for matching makes it possible to decrease the reflected wave of the output signal from the amplifier circuit to prevent attenuation of the output signal. Thus, the gain of the amplifier circuit can be improved.

The case of four field effect transistors 103 is illustrated as an example, but the number of field effect transistors 103 is not limited to four. Connecting n field effect transistors 103 in parallel makes it possible to obtain output power n times that in the case of one field effect transistor 103 is provided. By providing a plurality of field effect transistors 103 as described above, large output power can be obtained.

If terminating resistors are provided at the inductors 102 and 104 respectively, power is consumed by the terminating resistors to decrease the gain. In this embodiment, by providing the first balun circuit 101 and the second balun circuit 105 without providing the terminating resistors, the power consumption can be reduced to improve the gain.

Next, the operation of the amplifier circuit in this embodiment will be explained. The flows of signals are indicated with arrows in FIG. 1A. The differential signals are supplied from the first node N1 and the second node N2 to the gates of the field effect transistors 103 after being synthesized in the transmission paths of the first inductors 102. In other words, the differential signals are superposed by the principle of superposition and supplied to the gates of the field effect transistors 103. The amplified signals at the drains of the field effect transistors 103 are outputted to the third node N3 and the fourth node N4 while being synthesized in the transmission paths of the respective second inductors 104. The second balun circuit 105 synthesizes the signal at the third node N3 and the signal at the fourth node N4.

FIG. 2 is a chart illustrating a simulation result of frequency characteristics of the gain of the amplifier circuit in FIG. 1A. An S parameter S21 indicates the gain of the output signal with respect to the input signal into the amplifier circuit. An S parameter S11 indicates the magnitude of the reflected wave of the input signal into the amplifier circuit. An S parameter S22 indicates the magnitude of the reflected wave of the output signal from the amplifier circuit. At a high frequency of 250 GHz, the gain of the S parameter S21 is 8 dB, so that a high gain characteristic can be obtained. In this embodiment, even in the case where the plurality of field effect transistors 103 are provided to make the output power large, a high gain can be obtained at the high frequency. Note that though the example where the parameters are set so as to obtain a high gain near 250 GHz is illustrated in this embodiment, it is possible to change the frequency band at which the high gain can be obtained.

Figure 3A:
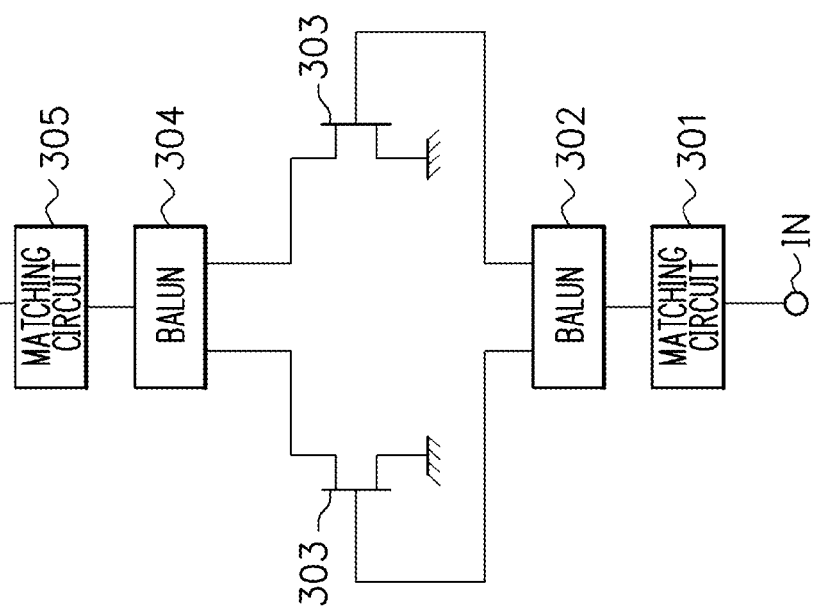
FIG. 3A is a diagram illustrating a configuration example of a differential amplifier circuit.

FIG. 3A is a diagram illustrating a configuration example of a differential amplifier circuit. An input matching circuit 301 is connected between an input terminal IN and a first balun circuit 302. The first balun circuit 302 converts a single-phase signal to differential signals, and outputs the differential signals to gates of two n-channel field effect transistors 303. Each of the field effect transistors 303 has a source connected to a reference potential node, and outputs an amplified signal from a drain. A second balun circuit 304 synthesizes the signals from the drains of the two field effect transistors 303, and outputs a resultant signal to an output terminal OUT via an output matching circuit 305. This differential amplifier circuit has the two field effect transistors 303 and therefore can obtain output power twice that in the case of one field effect transistor 303.

FIG. 3B is a chart illustrating a simulation result of frequency characteristics of the gain of the differential amplifier circuit in FIG. 3A. An S parameter S21 indicates the gain of the output signal with respect to the input signal into the amplifier circuit. An S parameter S11 indicates the magnitude of the reflected wave of the input signal into the amplifier circuit. An S parameter S22 indicates the magnitude of the reflected wave of the output signal from the amplifier circuit. At a high frequency of 250 GHz, the gain of the S parameter S21 is 5 dB that is lower than that in FIG. 2.

As described above, the amplifier circuit in FIG. 1A can increase the output power and increase the gain at a high frequency of 250 GHz more than the differential amplifier circuit in FIG. 3A because the number of the field effect transistors 103 can be increased.

Next, the number of the field effect transistors 103 will be explained. As described above, the differential signals at the nodes N1 and N2 pass through the right and left of the first inductors 102 and are superposed by the principle of superposition. In the case where the number of the field effect transistors 103 is an odd number, the signals in opposite phases are simultaneously inputted into the field effect transistor 103 located at the middle, so that the field effect transistor 103 located at the middle cannot amplify the signals. For this reason, in the case where the number of the field effect transistors 103 is an odd number, the output power to be obtained is merely n−1 times that in the case of one field effect transistor 103. In contrast, in the case where the number of the field effect transistors 103 is n that is an even number, the output power to be obtained is n times that in the case of one field effect transistor 103. Accordingly, the number of the field effect transistors 103 is preferably an even number.

Second Embodiment

Figure 4:
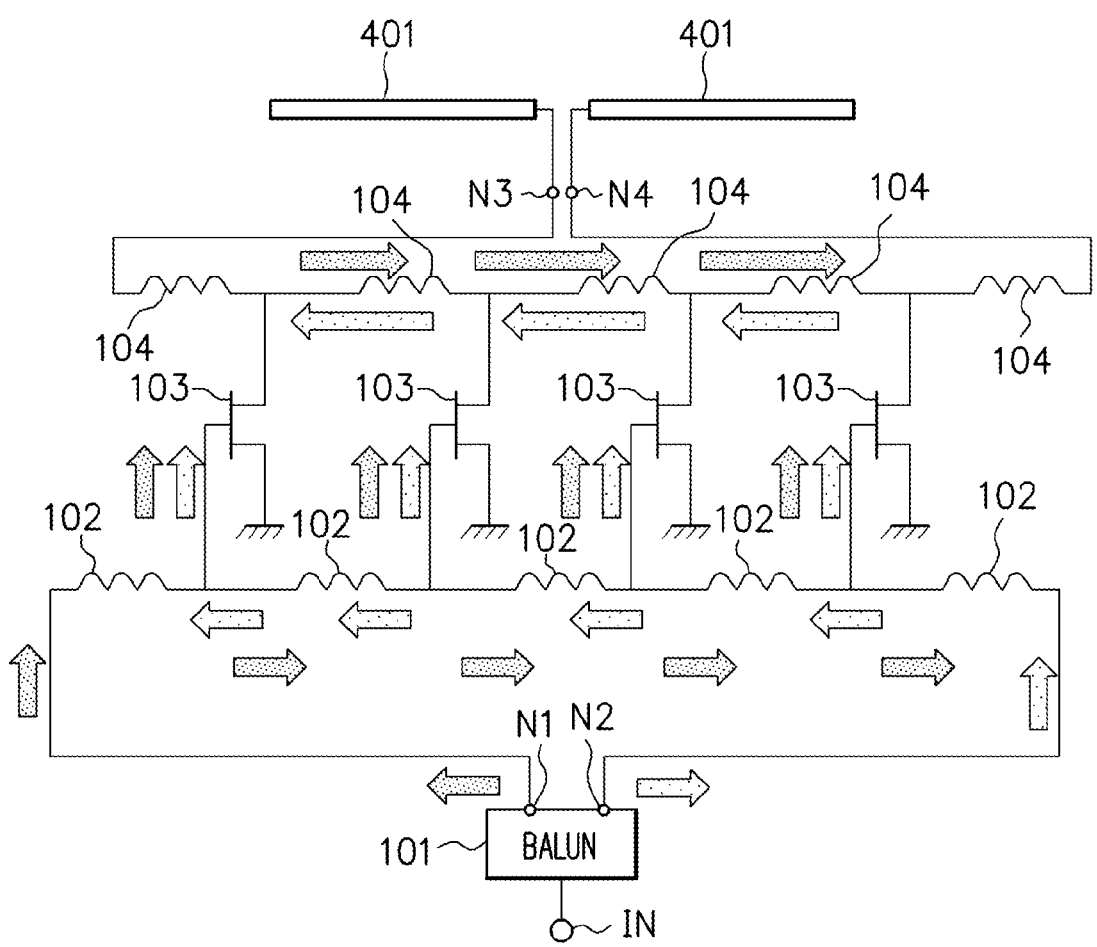
FIG. 4 is a diagram illustrating a configuration example of an amplifier according to a second embodiment.

FIG. 4 is a diagram illustrating a configuration example of an amplifier circuit according to a second embodiment. The amplifier circuit in FIG. 4 is made by providing dipole antennas 401 in place of the second balun circuit 105, with respect to the amplifier circuit in FIG. 1A. Hereinafter, the points that this embodiment is different from the first embodiment will be explained. The dipole antennas 401 are balanced-type antennas and synthesizing units that make signals at a third node N3 and a fourth node N4 into radio waves and synthesize them in space and output a radio signal. By the dipole antennas 401, the signal obtained by synthesizing the signals at the third node N3 and the fourth node N4 can be transmitted by wireless. In the case of using the amplifier circuit in FIG. 4 for a radio transmission device, the dipole antennas 401 can synthesize the signals, thus providing an advantage that the second balun circuit 105 in FIG. 1A becomes unnecessary.

As described above, according to the first and second embodiments, a high-frequency signal can be amplified with large output power and high gain.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier circuit comprising:
   first and second nodes configured to receive input of differential signals;
   third and fourth nodes;
   a plurality of first inductors configured to be connected in series between the first and second nodes;
   a plurality of second inductors configured to be connected in series between the third and fourth nodes;
   a plurality of field effect transistors configured to have gates each configured to be connected between the plurality of first inductors, sources each configured to be connected to a reference potential node, and drains each configured to be connected between the plurality of second inductors;
   dipole antennas configured to synthesize signals at the third and fourth nodes in space and output a radio signal; and
   a first balun circuit configured to convert a single-phase signal to differential signals, and output the differential signals to the first and second nodes.

2. The amplifier circuit according to claim 1, wherein a number of the plurality of field effect transistors is an even number.

* * * * *